United States Patent [19]

Hirai et al.

[11] 3,794,835

[45] Feb. 26, 1974

[54] IMAGE PICKUP DEVICE

[75] Inventors: Tadaaki Hirai; Eiichi Maruyama, both of Kodaira-shi, Tokyo, Japan

[73] Assignee: Hitachi Ltd., Tokyo, Japan

[22] Filed: Apr. 6, 1971

[21] Appl. No.: 131,717

[30] Foreign Application Priority Data

Apr. 6, 1970 Japan .............................. 45-28619

[52] U.S. Cl. .......................... 250/211 J, 317/235 N

[51] Int. Cl. ........................................... H01l 15/00

[58] Field of Search ............250/211 J; 317/235 N, 317/235 AC; 313/65 R, 65 T, 65 A, 65 AB

[56] References Cited

UNITED STATES PATENTS

| | | | |
|---|---|---|---|
| 2,687,484 | 8/1954 | Weiser | 317/235 N X |
| 2,826,725 | 3/1958 | Roberts | 317/235 AC |
| 3,439,240 | 4/1969 | Geib, Jr. et al. | 317/235 AC |
| 2,644,852 | 7/1953 | Dunlap, Jr. | 250/211 J X |
| 3,268,764 | 8/1966 | Simms | 250/211 J X |
| 3,322,955 | 5/1967 | Desvignes | 250/211 J X |
| 3,403,284 | 9/1968 | Buck et al. | 313/65 X |

*Primary Examiner*—Walter Stolwein
*Attorney, Agent, or Firm*—Craig and Antonelli

[57] ABSTRACT

A light conversion element used for a vidicon image pickup target characterized in that an amorphous semiconductor comprising more than 50 atomic percent of selenium and/or sulfur is disposed directly on a IV*a* group silicon, germanium or similar semiconductor single crystal or crystalline layer, or on such a semiconductor single crystal or crystalline layer with a very thin insulation layer, such as a very thin oxide layer interposed therebetween whereby a hetero-junction is formed in the element.

7 Claims, 3 Drawing Figures

INVENTORS
TADAAKI HIRAI
EIICHI MARUYAMA
BY
Craig, Antonelli & Hill
ATTORNEYS

IMAGE PICKUP DEVICE

BACKGROUND OF THE INVENTION

The present invention relates to hetero-junction photodiodes consisting of a IV*a* group element and an amorphous semiconductor comprising selenium and/or sulfur, and also to devices using such a hetero-junction photodiode.

The silicon p-n junction element is known as a characteristically excellent, highly sensitive photodiode operable at a high speed or response. The structure and operationsl mechanism of the so-called silicon target vidicon are also well known in the art wherein a silicon photodiode array is scanned with a low speed electron beam, thereby picking up images for television.

More specifically, the conventional silicon target vidicon is such that numbers of p-type diffusion regions are formed mutually independently on one whole surface of an n-type silicon substrate, light is projected on the surface opposite where no p-type diffusion regions are formed, and said surface having p-type regions is scanned by an electron beam. The light incident thereupon is absorbed chiefly by the n-type silicon substrate, thereby forming pairs of electrons and holes. The minority carriers (i.e., holes) produced thereby are diffused toward the p-n junction region. These carriers, however, are pushed to the p-type region by the force of the reverse bias field. The charge which is moved due to this carrier movement is stored on the p-type surface as the current energy being dicharged from the p-n junction capacity. This discharge current is read as an image signal by electron beam scanning. Said p-type region is disposed in the form of an isolated mesa on the n-type substrate. In order to allow the electron beam to scan only the p-type region, the n-type substrate surface is covered with an insulation layer, such as a $SiO_2$ layer. The whole scanning surface of the substrate is covered with a semi-insulation layer, such as a $Sb_2S_3$ layer, for the purpose of preventing undesirable phenomena, for example, the image vanishing phenomenon caused by the charge stored on the insulation layer.

The image pickup tube using such a photodiode array is operable at a high sensitivity and with low image persistence. On the other hand, however, this type of image pickup tube has drawbacks; for example. am image streak tends to occur due to inadvertent errors in the production process or defects in the crystal comprised therein. The photodiode array has on its scanning surface a region similar to an MOS transistor in nature, to bring about channeling between the p-type regions and results in creation of the image vanishing phenomenon. Furthermore, the $SiO_2$layer coating on the n-type region is not always stable and, hence, the life of the photodiode array is generally not as long as expected or desired.

It is apparent that said mesa p-type region disposed so as not to allow the charge on the surface of the p-type region to flow out gives rise to various undesirable phenomena which constitute major drawbacks inherent in the silicon target vidicon.

To remove the foregoing drawbacks in the prior art, a light-electric conversion device has been proposed in an article in Japanese, the title of which can be translated in English into "Characteristics of Hetero-Junction between CdS Single Crystal and Amorphous Semiconductor, and Its Application to Image Pickup Tube," in the journal "Television" (in Japanese) Vol. 24, No. 2, 1970, pages 157–158, published by Institute of Television Engineering of Japan. This light-electric conversion device comprises a $As_2Se_3$ amorphous semiconductor and a CdS single crystal formed in junction relatiohship. This device, though successful in removing said drawbacks in the prior art, is low in sensitivity in comparison with the conventional vidicon.

SUMMARY OF THE INVENTION

In view of th foregoing, a general object of this invention is to provide an image pickup element having as its photodiode a hetero-junction formed in the region of contact between an amorphous semiconductor comprising selenium and/or sulfur and a silicon or germanium element.

The amorphous semiconductor comprising selenium and/or sulfur, brought into contact with crystalline or noncrystalline semiconductor of various kinds, forms a hetero-junction. It has been found through experiments that a nonlinear current-voltage characteristic is present in the junction between a semiconductor — not only of the II-VI groups such as cadmium sulfide and cadmium selenide, but also of the IV*a* group such as silicon and germanium and the III-V group such as gallium arsenide and gallium phosphide — and an amorphous semiconductor comprising selenium and/or sulfur.

Generally, the amorphous semiconductor is considered to be advantageous in view of the following points.

1. An amorphous semiconductor element having a large, uniform surface area can easily be formed by vacuum evaporation methods or the like. Hence, the amorphous semiconductor is suited for use as the material of a device, such as a vidicon target, which may exhibit an image streak due to semiconductor surface defect.
2. The amorphous semiconductor is a semiconductor usually having a high specific resistance; for example, $10^{10}$ Ω. cm can be obtained depending on the constituents used. Therefore, when an amorphous semiconductor material is used for the p-type region on the photoconductive screen of the silicon target of an image pickup tube, it becomes possible to establich a sufficiently high resistance to prevent the surface charge from being diverted. This eliminates the need, as is conventional, for forming an isolated mesa p-type region for the photoconductive screen on the silicon target.

The other objects, features and advantages of the invention will be illustrated by the following non-limitative examples taken in conjunction with the accompanying drawings.

DESCRIPTION OF THE PREFERRED EMBODIMENTS

Example 1

Pure selenium in 90 atomic percent and pure arsenic in 10 atomic percent are enclosed in a quartz ampoule under a high vacuum of more than $10^{-6}$ Torr. The quartz ampoule, after being hermetically sealed, is placed in an electric oven and heated up to a temperature of about 1,000° C for 5 hours, to fuse and mix the ampoule sample. The ampoule is taken out of the oven and quenched to solidify the sample, which is then crushed. The resultant material is a p-type amorphous semiconductor whose specific resistance is about $10^{14}\Omega$- cm.

Figure 1:
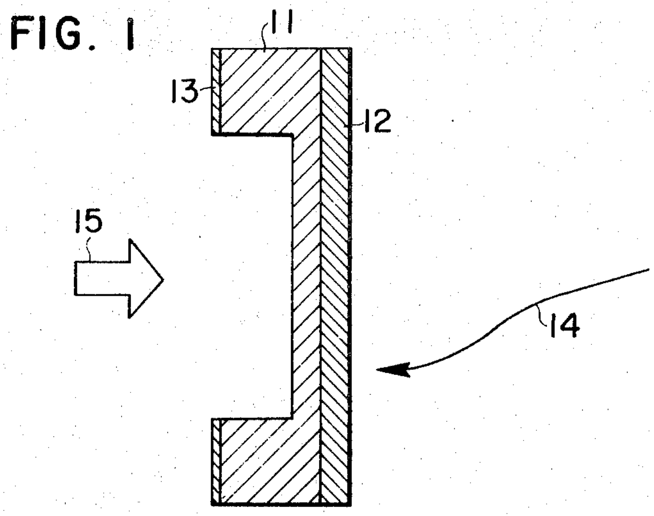
FIG. 1 is a cross sectional view showing an improved vidicon target.

Next, an n-type silicon wafer having a specific resistance of about 100 Ω-cm is polished and etched, thereby forming a substrate 11, as shown in FIG. 1. Namely, a circular hollow with a diameter of about 16mm is etched in the center part of the n-type silicon substrate 11 of which the diameter is 20 mm and the thickness is about 150$\mu$. The hollow part of the substrate is about 20$\mu$ thick. A layer 12 composed of said amorphous semiconductor is formed to a thickness of about 3 $\mu$ on the flat surface of said substrate by a conventional vacuum evaporation technique at a temperature of 20° to 50° C and under a vacuum of about $1X10^{-5}$ Torr.

The hetero-junction formed in the above manner is not necessarily sliced into mosaic form but can be used directly for the target of a vidicon image pickup tube. More specifically, metal electrode layers 13 are disposed by evaporation technique on the surface of the peripheral area on the side opposite to said surface coated with the amorphous semiconductor layers 12. The amorphous semiconductor layer 12 on the substrate 11 being held by any suitable means is scanned by a low speed electron beam 14. In doing this, the target is set between the electrodes of the image pickup tube so that the image may be received from the arrow direction 15.

This vidicon target can be fabricated by a simple production process because the resistance of the amorphous semiconductor formed on the side of the substrate, which side is to be scanned by a low speed electron beam, is high enough and therefore the target is not necessarily mosaic.

If, however, the resistance of an amorphous semiconductor material used is not sufficiently high to prevent the surface charge from being diverted, the amorphous semiconductor layer may be formed like an isolated mesa.

The properties, such as specific resistance and spectral sensitivity, of an amorphous semiconductor comprising selenium and/or sulfur can be controlled by adding various elements other than selenium and/or sulfur. For example, by adding arsenic, tellurium and the like to the amorphous semiconductor, the sensitivity to red light can be increased. While, by adding arsenic, antimony, phosphorus, germanium, silicon and the like, the crystallizing temperature can be increased. By adding tellurium, arsenic, sodium and the like, the specific resistance can be changed.

In this embodiment, an amorphous semiconductor comprising 90 atomic percent of selenium is used. Instead, an amorphous semiconductor comprising more than 50 atomic percent of selenium and/or sulfur may be used for the purpose of the photoelectric element of this invention. Note that if the selenium and/or sulfur content is below 50 atomic percent, it is difficult to form a hetero-junction suitable for the photoelectric element of this invention.

Comparing the device of this invention with the conventional device (proposed in the aformention publication) comprising a $As_2Se_3$ amorphous semiconductor and a CdS single crystal, it is obvious that the photosensivity in the visible ray region is about five times greater than that of the conventional vidicon; whereas, the photosensitivity of the proposed device is one-fifth that of the conventional vidicon.

EXAMPLE 2

Forty atomic percent of arsenic, 40 atomic percent of sulfur and 20 atomic percent of selenium are fused and mixed in the same manner as described in Example 1. The resultant material is deposited by vacuum evaporation technique to a thickness of about 2$\mu$ on a 20$\mu$ thick germanium substrate with a specific resistance of about 10Ω-cm. This device is suitable, for example, for electron microscope applications. According to this embodiment, a vidicon target for converting an electron beam image into a visible image is realized. The result of experiments on this vidicon target shows that a current gain of more than $10^4$ is obtained with an electron beam applied at an accelerating voltage of 50kV. This current gain is about four times greater than the value obtainable in the conventional target using only selenium.

It is now self-evident that the device of this invention is far simpler in the structure than the conventional silicon vidicon target having a mesa structure. Furthermore, the device of this invention has markedly higher sensitivity than the device (having no mesa structure) comprising a $As_2Se_3$ amorphous semiconductor and a CdS single crystal or the conventional device (comprising selenium) for converting an electron beam image into a visible image. In short, the device of this invention is highly practical for a broad range of industrial applications.

Figure 2:
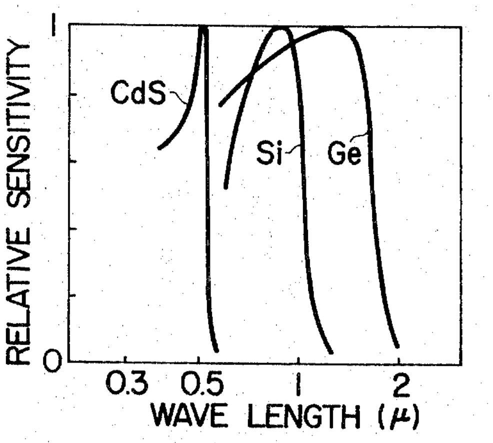
FIG. 2 is a graphic representation showing relative sensitivity charactisitics of materials used for this invention in comparison with the prior art.

In comparison with the device comprising a CdS single crystal and a $As_2Se_3$ amorphous semiconductor, the device of this invention has the following advantages.

a. In the device comprising a CdS single crystal and an amorphous semiconductor, the sensitivity to light is determined only by the CdS component. In other words, this device is effective only on light whose wavelength is shorter than 520m$\mu$ which is the absorption limit of CdS. On the other hand, as shown in FIG. 2, in which the abscissa and the ordinate represent the wavelength in logarithmic scale and the relative sensitivity in linear scale, respectively, silicon and germanium have their sensitivity wavelength ranging from visible to near-infrared rays. Hence, the silicon or germanium photodiode for visible ray applications can have a higher sensitivity than that using cadmium sulfide.

b. As the single crystal used for forming a photodiode with a large surface area, silicon and germanium are more easily obtainable than cadmium sulfide.

c. Polishing and etching processes are easier to perform on silicon or germanium than on a compound semiconductor, such as cadmium sulfide.

d. When a compound semiconductor single crystal is used for the image pickup target, the etching process is indispensable. In the etching process, the etching solution acts selectively on the individual compound elements. This makes it difficult to obtain a mirror surface and to avoid the image streak phenomenon which results during the image pickup operation. Whereas, in the device using a singular semiconductor crystal, such as germanium or silicon, there is no fear of causing an image streak. The invention has been illustrated above by way of specific embodiments using a vidicon target sensitive to light in the range of near-infrared to visible rays and also a vidicon target for converting an electron beam image into a visible image. The invention is not limited to these vidicon targets. For example, the invention can make an image pickup target available for use in X-ray image pickup applications since the Si-Se hetero-junction of this invention is sensitve not only to the visible rays and high speed electron rays but also to X-rays.

In the foregoing description, the term "amorphous" is used. More strictly, the "amorphous" semiconductor comprising selenium and/or sulfur is not necessarily perfectly amorphous but may be partially crystallized or an agglomeration of crystallines. The amorphous semiconductor material used for the purpose of this invention depends upon the allowable dark current which flows therein, and upon the surface resistance which, in the vidicon image pickup tube, must be high enough to prevent the surface charge from being diverted. It is noted that the term "amorphous" mentioned in this specification is to defined not the degree of crystalization but the range of the specific resistance thereof.

Generally, the specific resistance of a photoconductive material used for the photoconductive surface of a vidicon screen is supposed to be more than $10^{10}\Omega$-cm in the case of a structure having no high resistance layer, such as a junction. The amorphous photoconductive element satisfying the requirement of said specific resistance range includes Se, $Sb_2S_3$, $As_2Se_3$, $As_2S_3$, etc. The crystalline photoconductive elements such as ZnS, ZnSe and CdSe can be considered as elements satisfying said specific resistance requirement depending on the target conditions. A hetero-junction formed between the cited crystalline photoconductive element and silicon or germanium may be used for the purpose of this invention even though such element is crystalline.

If the surface of an amorphous semiconductor element comprising selenium and/or sulfur tends to release secondary electrons and thus to result in black-white image inversion, this phenomenon can be prevented by forming a thin layer, such as a thin $Sb_2S_3$ layer, on the surface of said amorphous semiconductor by vacuum evaporation technique.

When it is desired for the vidicon target of this invention to have a higher sensitivity to blue light, a thin n+ diffusion layer is formed on the silicon surface upon which light is incident as in the conventional silicon target. The loss due to reflection of incident light from the surface thereof can be reduced by disposing a thin $CaF_2 \cdot MgF_2$ layer closely on the surface.

Figure 3:
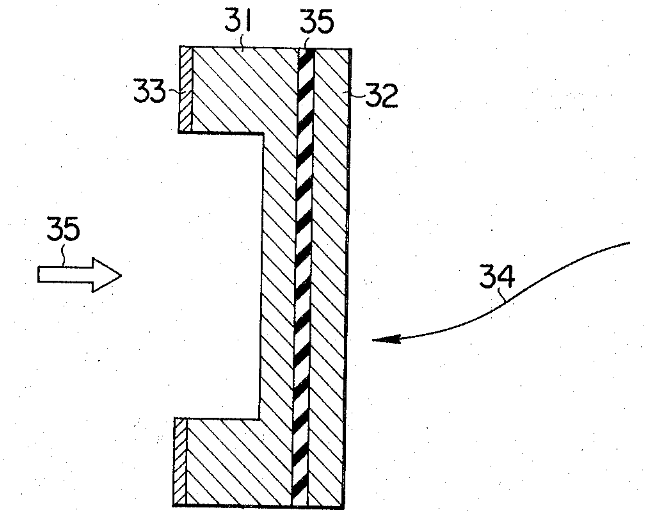
FIG. 3 is a cross-sectional view of another embodiment of the present invention.

The n-type silicon substrate 11, as in Example 1, is not necessarily formed of a single crystal but may be formed of a crystalline layer. Also, the substrate is not necessarily disposed directly adjacent to the amorphous semiconductor layer, but this insulation layer 35 comprising an oxide or the like may be interposed between a substrate 31 and an amorphous semiconductor layer 32, as seen in the embodiment of FIG. 3. As in the embodiment of FIG. 1, metal electrode layers 33 are disposed on the semiconductor layer 31 and the semiconductor layer 32 is scanned by a low speed electron beam 34 while the image is received from the arrow direction 35.

While a few embodiments of the invention have been illustrated and described in detail, it is particularly understood that the invention is not limited thereto or thereby.

We claim:

1. A light electric conversion element comprising a semiconductor substrate made of an element belonging to the IV*a* group of the Periodic Table; an amorphous semiconductor layer deposited on said semiconductor substrate and being formed of more than 50 atomic percent of a material selected from the group consisting of selenium, sulfur and a mixture of selenium and sulfur, thereby forming a heterojunction therebetween; and an electrode deposited on the surface of the peripheral area of said semiconductor substrate on the side thereof opposite to said amorphous semiconductor layer, wherein said semiconductor substrate is of n-type material and said amorphous semiconductor layer is of p-type material and has a specific resistance greater than $10^{10}$ ohm-cm.

2. A light electric conversion element according to claim 1, wherein said semiconductor substrate is made of an element selected from the group consisting of germanium and silicon.

3. A light electric conversion element according to claim 1, wherein a very thin insulation layer is interposed between said semiconductor substrate and said amorphous semiconductor layer.

4. A light electric conversion element according to claim 3, wherein said semiconductor substrate is made of an element selected from the group consisting of germanium and silicon.

5. An image pickup element in the form of a photodiode comprising a hetero-junction formed in the region of contact between an amorphous semiconductor and a semiconductor substrate selected from the group consisting of silicon and germainium, wherein said amorphous semiconductor comprises 90 atomic percent of selenium and approximately 10 atomic percent of arsenic.

6. An image pickup element in the form of a photodiode comprising a hetero-junction formed in the region of contact between an amorphous semiconductor and a semiconductor substrate selected from the group consisting of silicon and germanium, wherein said amorphous semiconductor comprises 40 atomic percent of sulfur, substantially 20 atomic percent of selenium, and substantially 40 atomic percent of arsenic.

7. An image pickup element as defined in claim 6, wherein a thin insulation layer comprising an oxide is interposed between said amorphous semiconductor and said semiconductor substrate.

* * * * *